United States Patent
Uechi et al.

(10) Patent No.: US 11,404,572 B2
(45) Date of Patent: Aug. 2, 2022

(54) SEMICONDUCTOR DEVICE

(71) Applicant: Kioxia Corporation, Tokyo (JP)

(72) Inventors: Tadayoshi Uechi, Kawasaki Kanagawa (JP); Takashi Izumida, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 43 days.

(21) Appl. No.: 16/816,871

(22) Filed: Mar. 12, 2020

(65) Prior Publication Data
US 2021/0091221 A1  Mar. 25, 2021

(30) Foreign Application Priority Data
Sep. 19, 2019 (JP) .............................. JP2019-170769

(51) Int. Cl.
*H01L 29/78* (2006.01)
*H01L 21/8234* (2006.01)
*H01L 21/8238* (2006.01)

(52) U.S. Cl.
CPC .. *H01L 29/7846* (2013.01); *H01L 21/823481* (2013.01); *H01L 21/823878* (2013.01)

(58) Field of Classification Search
CPC ......... H01L 29/7846; H01L 21/823878; H01L 21/823481
See application file for complete search history.

(56) References Cited

U.S. PATENT DOCUMENTS

| 4,908,327 A | * | 3/1990 | Chapman | ........ H01L 21/823814 438/231 |
| 5,902,128 A | * | 5/1999 | Mathews | .......... H01L 21/76202 438/440 |
| 6,281,050 B1 | | 8/2001 | Sakagami | |
| 7,541,259 B2 | | 6/2009 | Yi | |

(Continued)

FOREIGN PATENT DOCUMENTS

| JP | 2001-68652 A | 3/2001 |
| JP | 2008-28357 A | 2/2008 |

(Continued)

OTHER PUBLICATIONS

Aziz, "Thermodynamics of diffusion under pressure and stress: Relation to point defect mechanisms", Applied Physics Letters, vol. 70, No. 21, 1997, pp. 2810-2812.

(Continued)

*Primary Examiner* — John A Bodnar
(74) *Attorney, Agent, or Firm* — Foley & Lardner LLP

(57) ABSTRACT

According to one embodiment, a semiconductor device includes an element region, an element isolation region adjacent to the element region, a gate insulating layer provided on an upper surface of the element region, and a gate electrode including a semiconductor layer, the semiconductor layer containing boron (B) and including a portion provided on the gate insulating layer, the element isolation region including an upper portion including an upper surface of the element isolation region and a lower portion including a lower surface of the element isolation (Continued)

region, and the upper portion of the element isolation region applying compressive stress to a portion of the element region, which is adjacent to the upper portion of the element isolation region.

17 Claims, 15 Drawing Sheets

(56) References Cited

U.S. PATENT DOCUMENTS

| | | | | |
|---|---|---|---|---|
| 8,350,253 | B1 * | 1/2013 | Zhu | H01L 29/7848 257/19 |
| 2006/0220142 | A1 * | 10/2006 | Tamura | H01L 21/823807 257/374 |
| 2008/0293194 | A1 * | 11/2008 | Chen | H01L 21/2652 438/199 |
| 2010/0155819 | A1 | 6/2010 | Ogoshi | |
| 2011/0248353 | A1 * | 10/2011 | Bhattacharyya | H01L 29/7849 257/369 |

FOREIGN PATENT DOCUMENTS

| | | |
|---|---|---|
| JP | 2010-147394 A | 7/2010 |
| JP | 5103804 B2 | 12/2012 |

OTHER PUBLICATIONS

Chen "Effect of uniaxial strain on anisotropic diffusion in silicon", Applied Physics Letters, vol. 89, 2006, pp. 161908-1-161908-3.

Laudon, "Multiscale modeling of stress-mediated diffusion in silicon: Ab initio to continuum", Applied Physics Letters, vol. 78, No. 2, 2001, pp. 201-203.

* cited by examiner

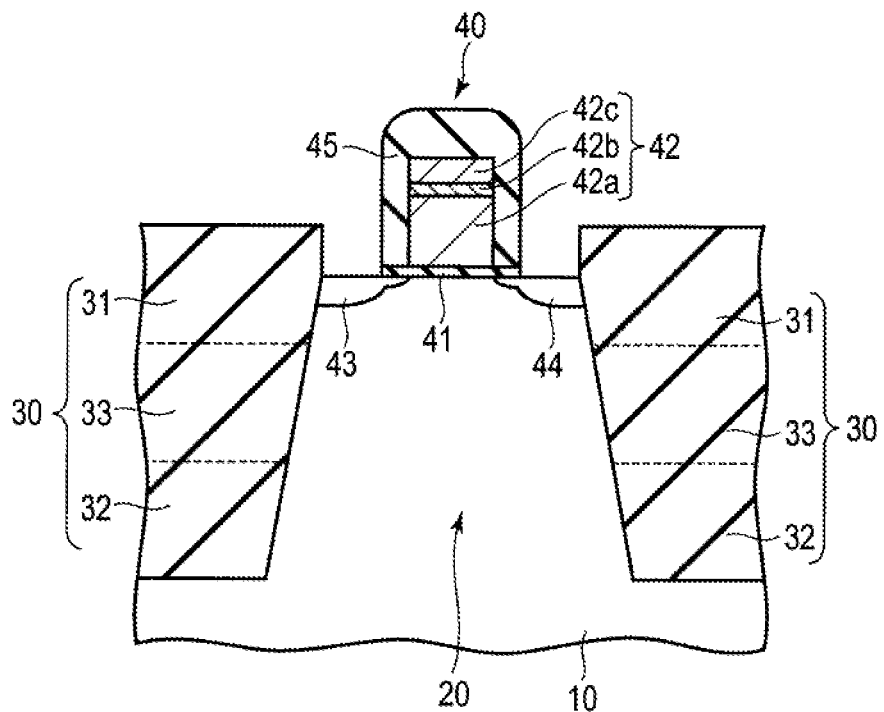
F I G. 2B
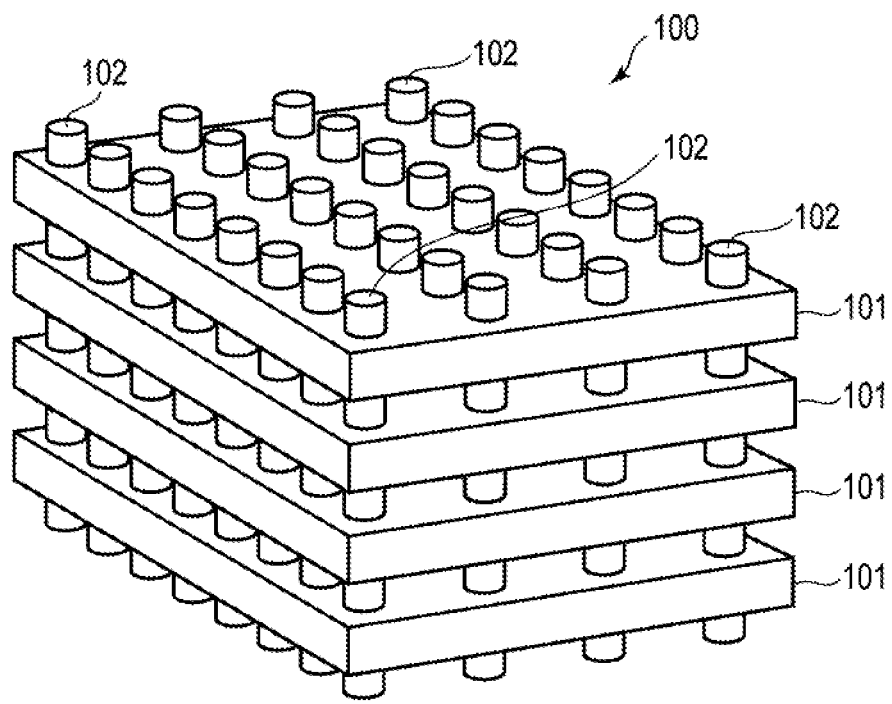
F I G. 3

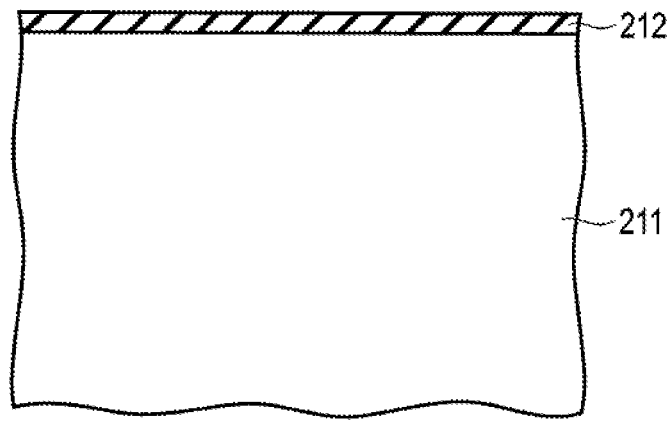
F I G. 4A
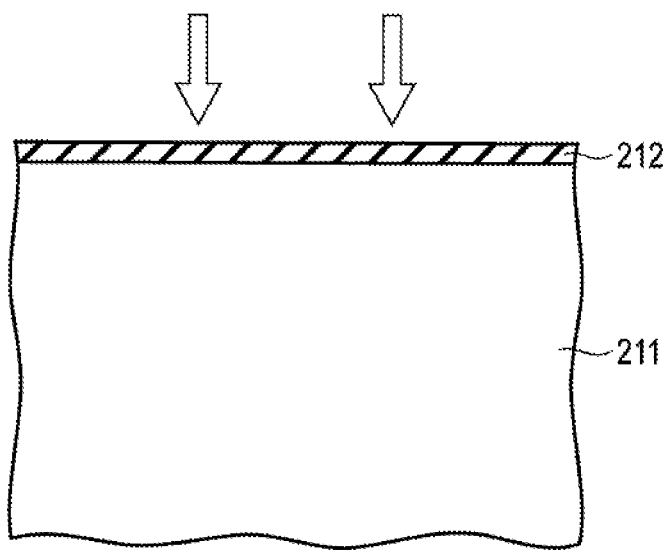
F I G. 4B

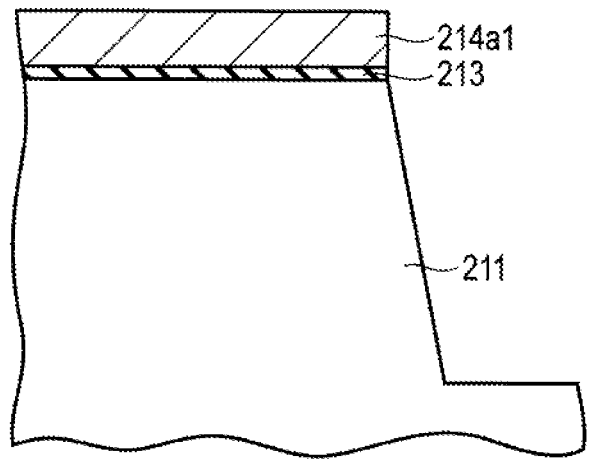
F I G. 4E
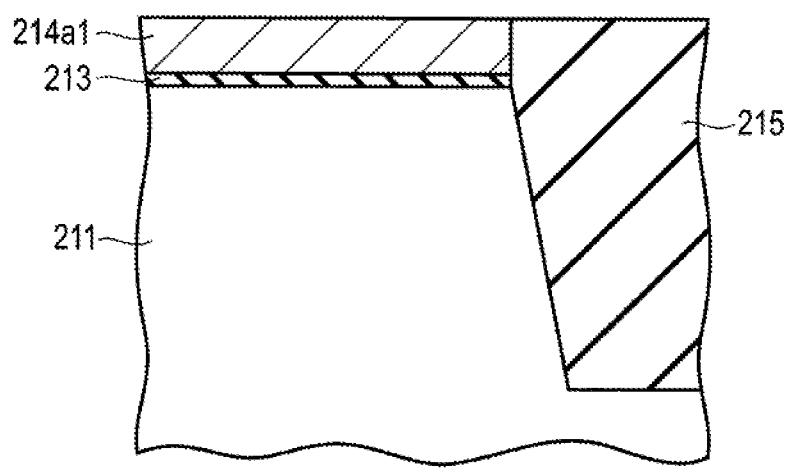
F I G. 4F

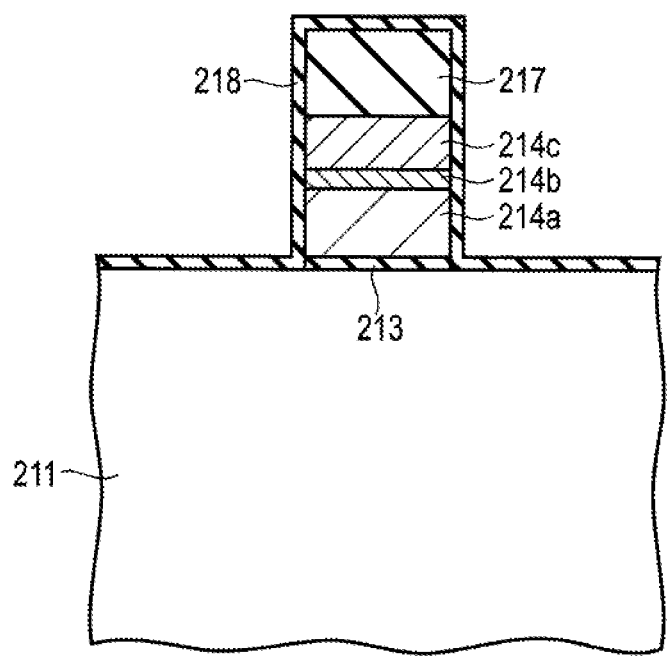
F I G. 5B
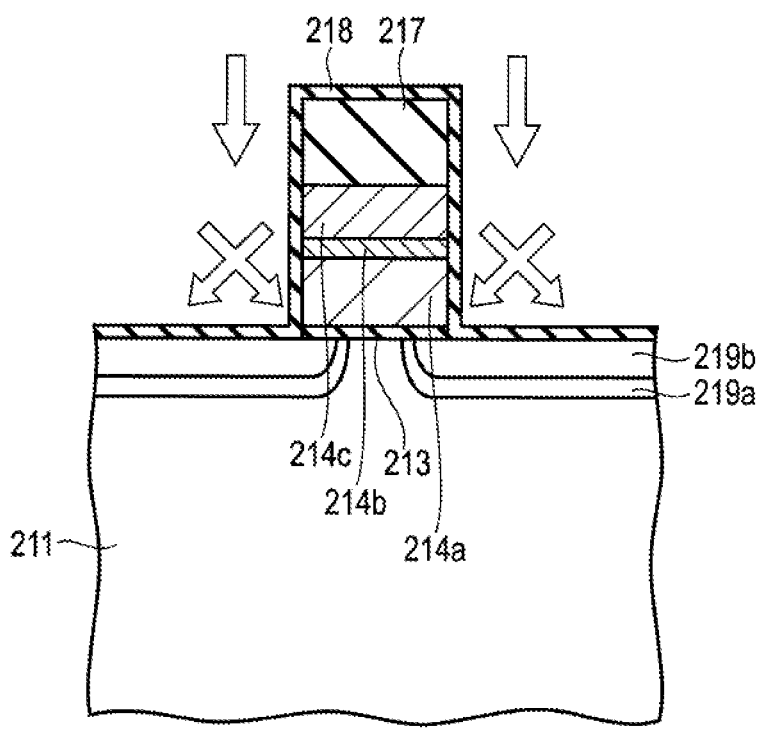
F I G. 5C

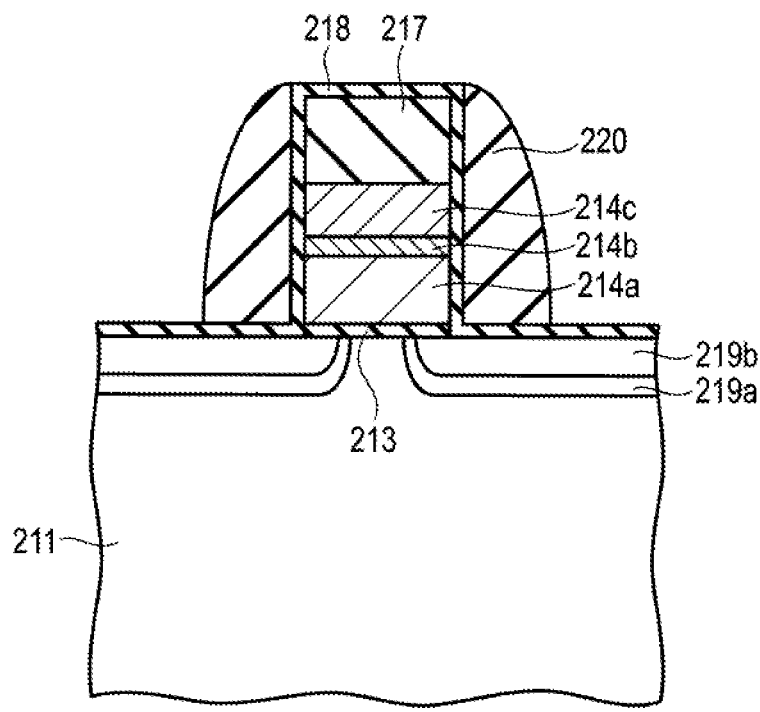
F I G. 5D
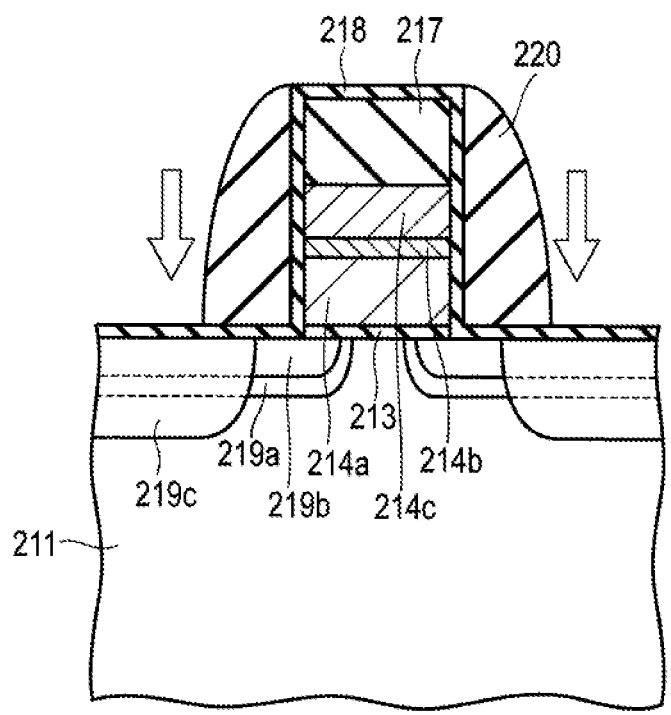
F I G. 5E

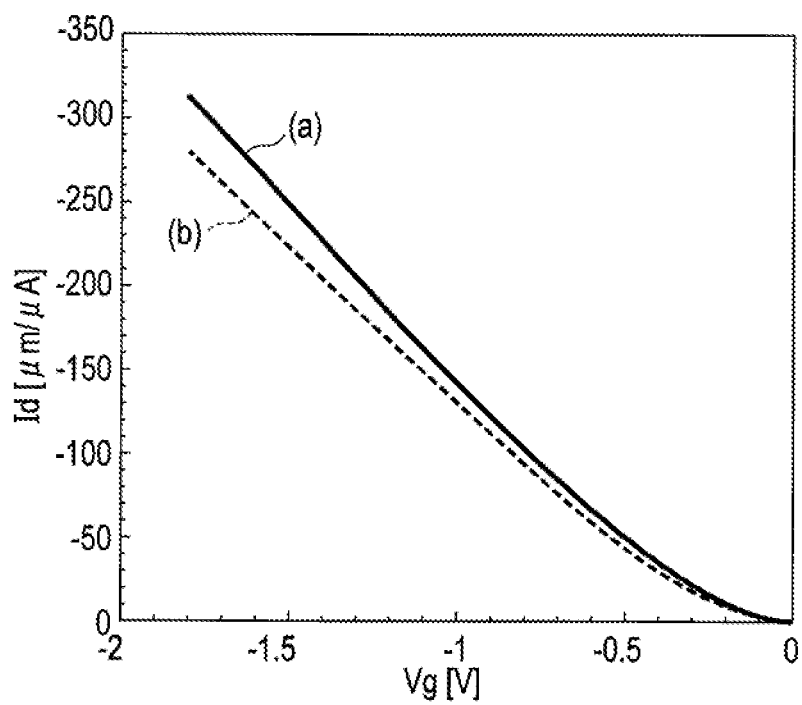
F I G. 9
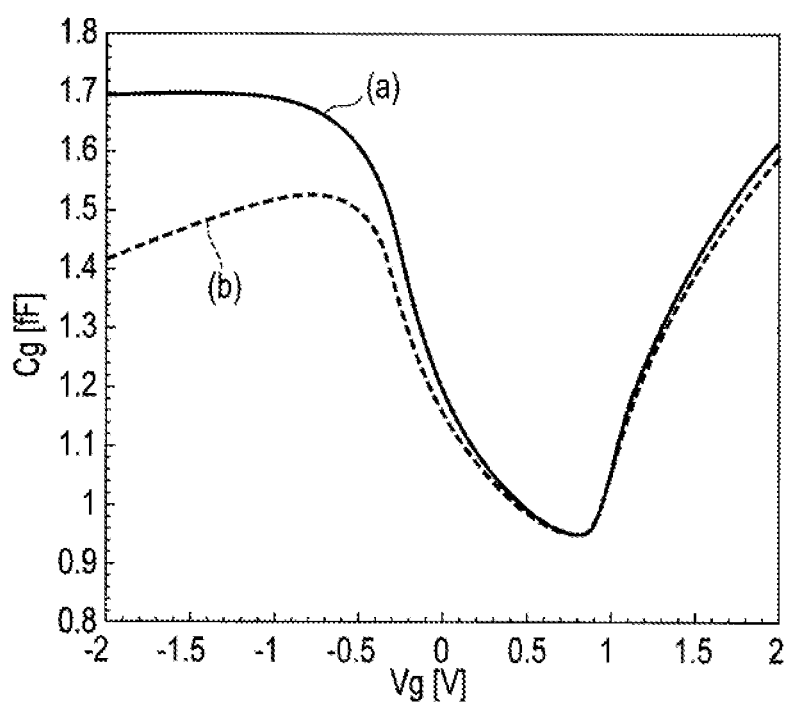
F I G. 10

SEMICONDUCTOR DEVICE

CROSS-REFERENCE TO RELATED APPLICATIONS

This application is based upon and claims the benefit of priority from Japanese Patent Application No. 2019-170769, filed Sep. 19, 2019, the entire contents of which are incorporated herein by reference.

FIELD

Embodiments described herein relate generally to a semiconductor device.

BACKGROUND

The MOS transistor used for semiconductor integrated circuits entails a drawback in which penetration of boron (B) contained in the semiconductor layer of the gate electrode may cause an adverse effect on characteristics and reliability of the transistor.

BRIEF DESCRIPTION OF THE DRAWINGS

FIGS. 2A and 2B each is a cross section schematically showing the structure of the semiconductor device according to the embodiment.

FIG. 3 is a diagram schematically showing the structure of a memory array portion of a NAND flash memory of a three-dimensional structure.

FIGS. 4A, 4B, 4C, 4D, 4E, 4F, 4G, 4H, 4I, 4J and 4K each is a cross section schematically showing a part of a method of manufacturing the semiconductor device according to the embodiment.

FIGS. 5A, 5B, 5C, 5D and 5E each is a cross section schematically showing a part of a method of manufacturing the semiconductor device according to the embodiment.

FIG. 9 is a diagram showing a result of simulation in the relationship between a gate voltage Vg and a drain current Id of the MOS transistor in each of the embodiment and a comparative example.

FIG. 10 is a diagram showing a result of simulation in the relationship between the gate voltage Vg and a gate capacitance Cg of the MOS transistor in each of the embodiment and the comparative example.

DETAILED DESCRIPTION

In general, according to one embodiment, a semiconductor device includes: an element region; an element isolation region adjacent to the element region; a gate insulating layer provided on an upper surface of the element region; and a gate electrode including a semiconductor layer, the semiconductor layer containing boron (B) and including a portion provided on the gate insulating layer; the element isolation region including an upper portion including an upper surface of the element isolation region and a lower portion including a lower surface of the element isolation region; and the upper portion of the element isolation region applying compressive stress to a portion of the element region, which is adjacent to the upper portion of the element isolation region.

Figure 1:
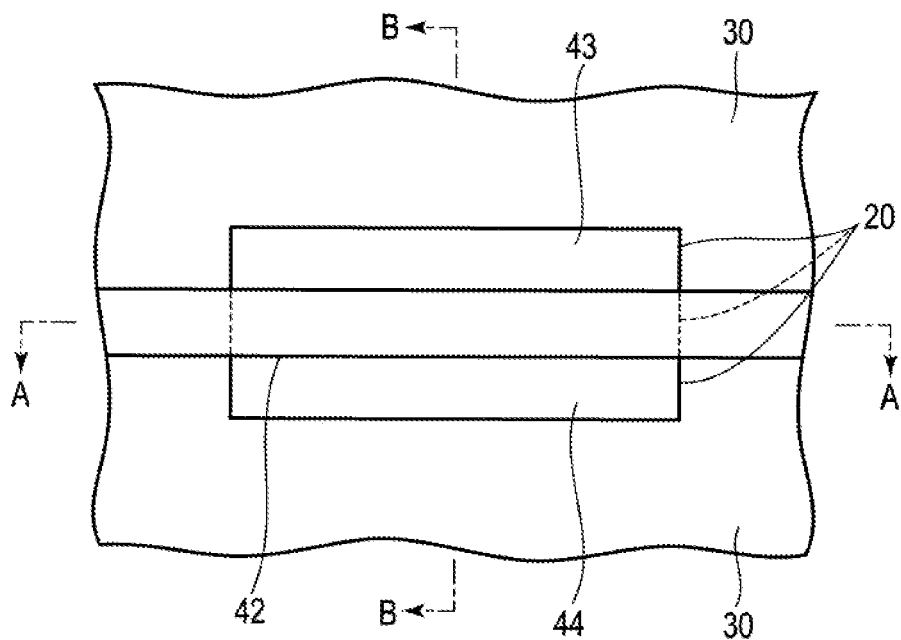
FIG. 1 is a plan view schematically showing a structure of a semiconductor device according to an embodiment.
Figure 2A:
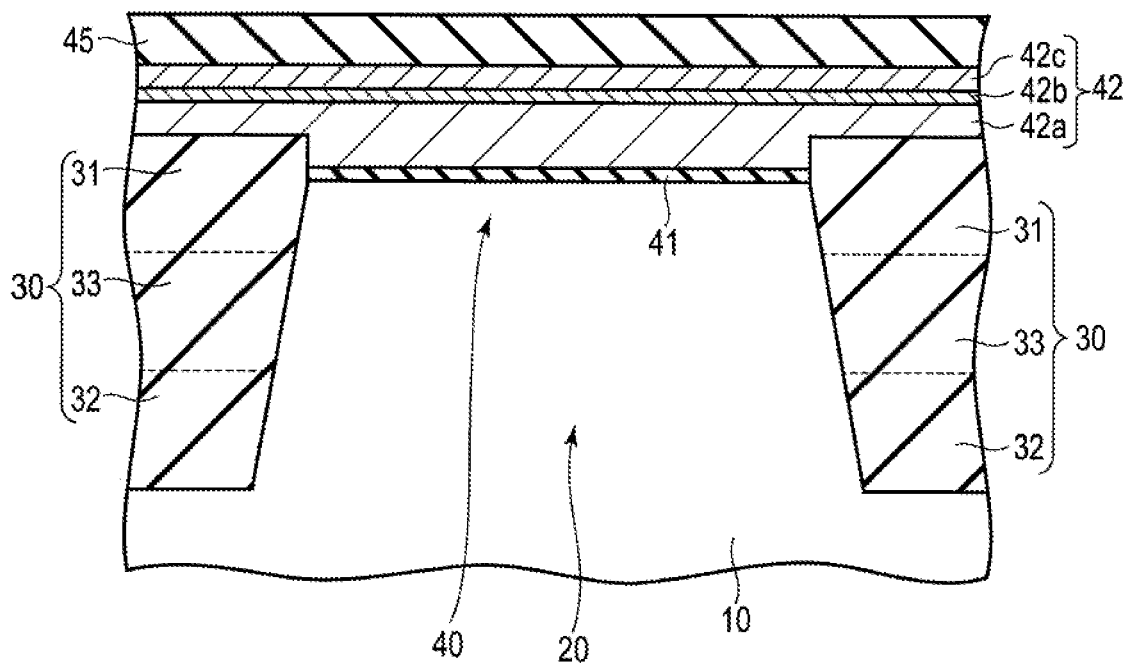

One of the embodiments will now be described with reference to drawings. FIG. 1 is a plan view schematically showing the structure of a semiconductor device according to the embodiment. FIGS. 2A and 2B each are a cross section schematically showing the structure of the semiconductor device according to the embodiment. A cross section taken along line A-A of FIG. 1 corresponds to FIG. 2A, and a cross section taken along line B-B of FIG. 1 corresponds to FIG. 2B.

In the structure shown in FIG. 1, FIGS. 2A and 2B, an element region (active area) 20 and an element isolation region 30 are provided in a surface area of a semiconductor substrate (silicon substrate) 10. The element isolation region 30 is provided adjacent to the element region 20 so as to surround the element region 20. The material of the element region 20 is silicon and the material of the element isolation region 30 is a silicon oxide.

In the surface area of the element region 20, a MOS transistor 40 is formed, which includes a gate insulating layer 41, a gate electrode 42, a source region 43, a drain region 44 and an insulating layer 45.

The gate insulating layer 41 is formed on an upper surface of the element region 20, and is formed of a silicon oxide.

The gate electrode 42 includes a portion provided on the gate insulating layer 41, and a portion provided on an upper surface of the element isolation region 30, and includes a semiconductor layer 42a, a tungsten nitride layer (WN layer) 42b provided on the semiconductor layer 42a and a tungsten layer (W layer) 42c provided on the tungsten nitride layer 42b.

The semiconductor layer 42a is formed of (boron (B)-doped) silicon (polysilicon) containing boron (B), and includes a portion provided on the gate insulating layer 41 and a portion provided on the upper surface of the element isolation region 30. More specifically, the semiconductor layer 42a includes a portion in contact with the gate insulating layer 41 and a portion in contact with the upper surface of the element isolation region 30, and has an upper surface located higher in level than the upper surface of the element isolation region 30.

The MOS transistor 40 described above is used for a peripheral circuit of a three-dimensional NAND flash memory. The MOS transistor 40 and the three-dimensional NAND flash memory are provided on the same semiconductor substrate 10.

FIG. 3 is a diagram schematically showing the structure of the memory array portion of the three-dimensional NAND flash memory. As shown in FIG. 3, the memory array portion 100 has a structure in which a plurality of gate electrode layers 101 and a plurality of insulating layers (not shown) are alternately stacked one on another, and a pillar-shaped structure 102 formed of silicon or the like is provided in this stacked structure. One gate electrode layer 101 and one pillar-shaped structure 102 constitute one memory cell, and a plurality of such memory cells are connected to each other in series to form a NAND string.

The element isolation region 30 is formed of a silicon oxide having low Young's modulus (for example, a material containing fluoride, carbon and a methyl group or a material containing 1 atomic % or less of nitrogen). Specifically, the element isolation region 30 includes an upper portion 31 including the upper surface of the element isolation region 30, a lower portion 32 including the lower surface of the element isolation region 30, and a middle portion 33 between the upper portion 31 and the lower portion 32, and the concentration of fluorine (F) contained in the element isolation region 30 is higher in the upper portion 31 than in the lower portion 32.

Note that, generally, there is not necessarily a clear boundary between the upper portion 31 and the middle portion 33, described above or between the lower portion 32 and the middle portion 33. Moreover, in each of the upper portion 31, the lower portion 32 and the middle portion 33, the fluorine concentration may not necessarily be even. For example, in the middle portion 33, the fluorine concentration may decrease from an upper portion 31 side towards a lower portion 32 side. Moreover, the lower portion 32 may not necessarily contain fluorine.

Generally, if a silicon oxide contains fluorine, the Young's modulus of the silicon oxide is low, and the Young's modulus of a silicon oxide decreases as the concentration of fluorine contained in the silicon oxide increases. Therefore, the upper portion 31 of the element isolation region 30 has a Young's modulus lower than that of the lower portion 32 of the element isolation region 30.

In this embodiment, the upper portion 31 of the element isolation region 30 is formed of a silicon oxide containing high-concentration fluorine. Therefore, the upper portion 31 of the element isolation region 30 has low Young's modulus. As a result, in this embodiment, the upper portion 31 of the element isolation region 30 applies compressive stress to an adjacent portion of the element region 20. That is, the upper portion 31 of the element isolation region 30 applies compressive stress to the portion of the element region 20, which is adjacent to the upper portion 31 of the element isolation region 30. Thus, with the structure of this embodiment, it is possible to suppress the penetration of boron contained in the semiconductor layer 42a constituting the gate electrode 42, to the element region 20, which is problematic with the conventional structure. Hereafter, an explanation thereof will be provided.

It is known that boron has high diffusion coefficient. Therefore, if the heat load is high, the penetration of boron occurs to cause an adverse effect on the characteristics and reliability of the transistor. In a peripheral transistor integrated with a memory cell on the same substrate, heat load is applied during the formation of the memory cell, making it easy for boron to penetrate. Conventionally, such penetration of boron may cause an adverse effect on the characteristics and reliability of the transistor. Moreover, the impurities contained in the material may change the diffusion coefficient according to the stress. Usually, the diffusion coefficient of boron increases according to tensile stress and decreases according to compressive stress.

In this embodiment, the upper portion 31 of the element isolation region 30 applies compressive stress to the adjacent portion of the element region 20, and therefore the penetration of boron can be suppressed. That is, compressive stress is applied to a gate electrode 42 side of the element region 20, it is possible to effectively suppress the penetration of boron contained in the semiconductor layer 42a, which constitutes the gate electrode 42, to the element region 20.

Moreover, in this embodiment, the fluorine concentration is higher in the upper portion 31 of the element isolation region 30 than in the lower portion 32. Therefore, the Young's modulus is higher in the lower portion 32 of the element isolation region 30 than in the upper portion 31. Thus, since the Young's modulus is high in the lower portion 32 of the element isolation region 30, the lower portion 32 of the element isolation region 30 applies tensile stress to the adjacent portion of the element region 20. That is, the lower portion 32 of the element isolation region 30 applies tensile stress to the portion of the element region 20, which is adjacent to the lower portion 32 of the element isolation region 30. Therefore, the element region 20 as a whole is placed in a well-balanced state between compressive stress and tensile stress. In other words, since the lower portion 32 of the element isolation region 30 applies tensile stress to the adjacent portion of the element region 20, it makes even more easier for the upper portion 31 of the element isolation region 30 to apply compressive stress to the adjacent portion of the element region 20. As a result, in this embodiment, the penetration of boron can be suppressed more effectively.

Next, a method of manufacturing a semiconductor device according to this embodiment will be described with reference to FIGS. 4A to 4K and FIGS. 5A to 5E. FIGS. 4A to 4K are cross sections parallel to the extending direction of the gate electrode, and FIGS. 5A to 5E are cross sections perpendicular to the extending direction of the gate electrode.

First, as shown in FIG. 4A, an oxide film 212 is formed on an n-type silicon layer 211 of the semiconductor substrate (silicon substrate).

Next, as shown in FIG. 4B, an n-type impurity (for example, arsenic (As) or phosphorus (P)) is doped in the silicon layer 211 through the oxide film 212, and thus an n-type well region (or channel region) is formed.

Figure 4C:
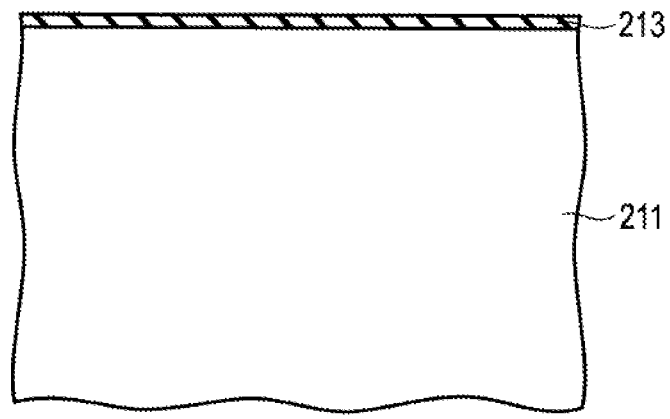

Next, as shown in FIG. 4C, after removing the oxide film 212, an insulating layer 213 serving as a gate insulating layer is formed on the n-type silicon layer 211.

Figure 4D:
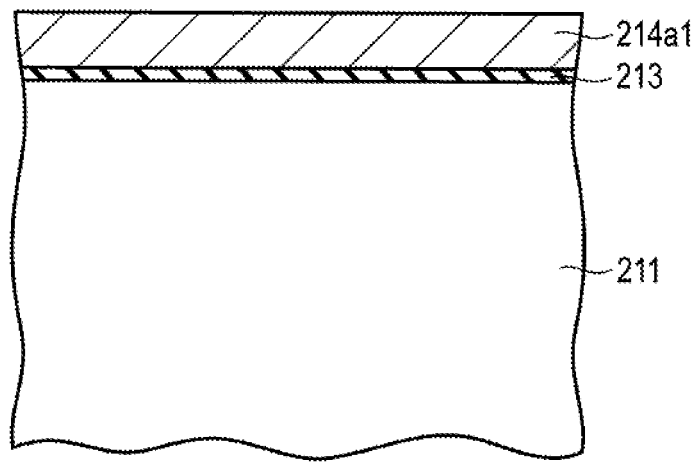

Next, as shown in FIG. 4D, a polysilicon layer 214a1 is formed on the insulating layer 213.

Next, as shown in FIG. 4E, a resist mask (not shown) is formed on the polysilicon layer 214a1, and the polysilicon layer 214a1 is patterned using the resist mask as a mask. Further, the insulating layer 213 and the silicon layer 211 are patterned using the patterned polysilicon layer 214a1 as a mask. Thus, a concavity for element isolation region is formed.

Next, a process for forming an insulating layer having low Young's modulus, for element isolation region is carried out by a method as illustrated below.

First, as shown in FIG. 4F, after oxidizing the silicon layer 211, an insulating layer 215 is formed. Then, CMP is carried out using the polysilicon layer 214a1 as a stopper so that the insulating layer 215 remains in the concavity for the element isolation region. Next, a first method or a second method, which will be illustrated below, is carried out.

Figure 4G:
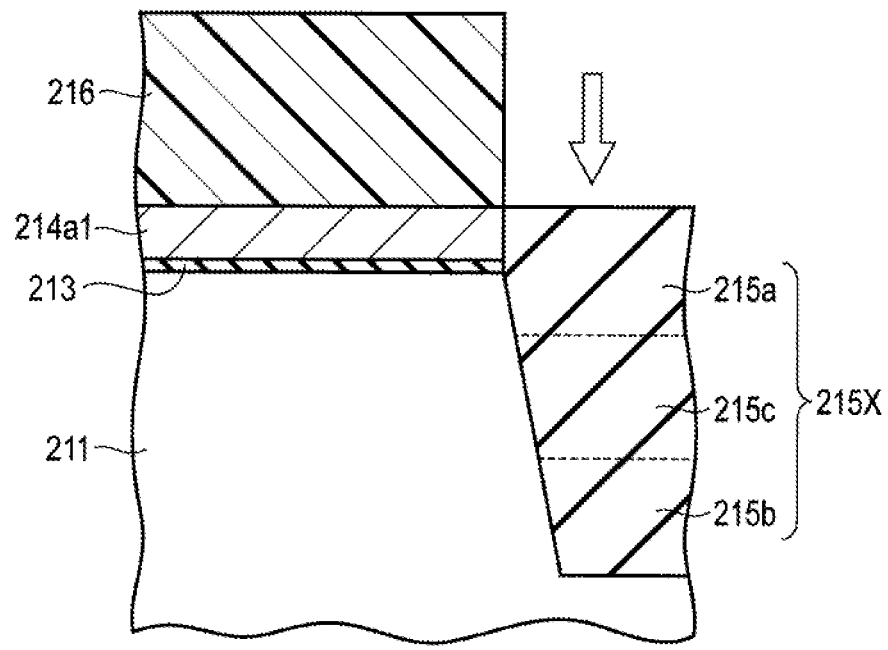

In the first method, as shown in FIG. 4G, a resist mask 216 is formed on the polysilicon layer 214a, and fluorine is doped to the insulating layer 215 by ion implantation using the resist mask 216 as a mask.

Figure 4H:
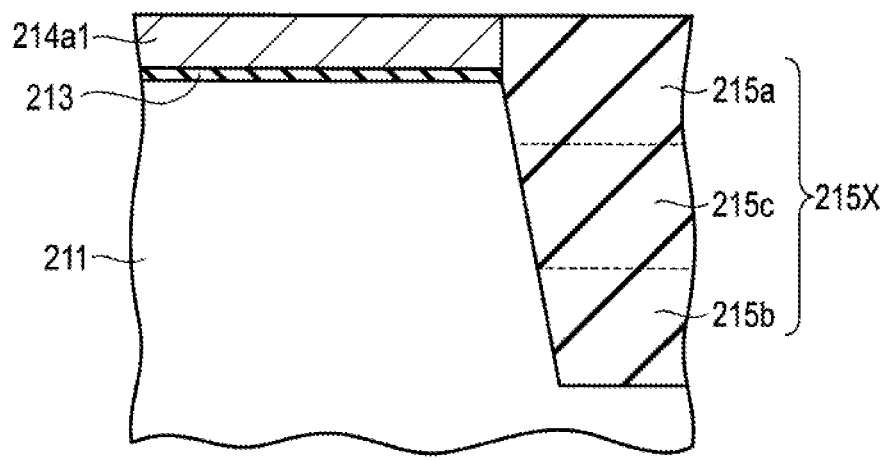

Here, the fluorine concentration of the upper portion 215a of the insulating layer 215 can be made higher than that of the lower portion 215b and that of the middle portion 215c by adjusting the energy of ion implantation. Thus, an insulating layer 215X including the upper portion 215a having low Young's modulus is obtained. That is, the insulating layer 215X corresponding to the element isolation region 30 shown in FIG. 2A is obtained. Then, by removing the resist mask 216, such a structure as shown in FIG. 4H is obtained.

Figure 4I:
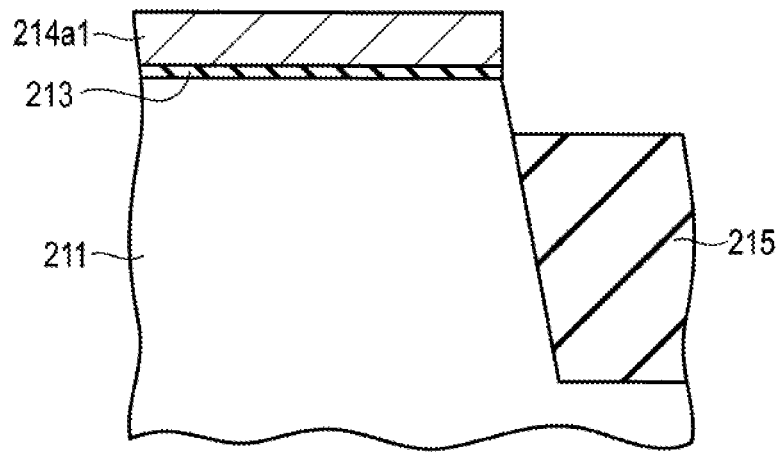
Figure 4J:
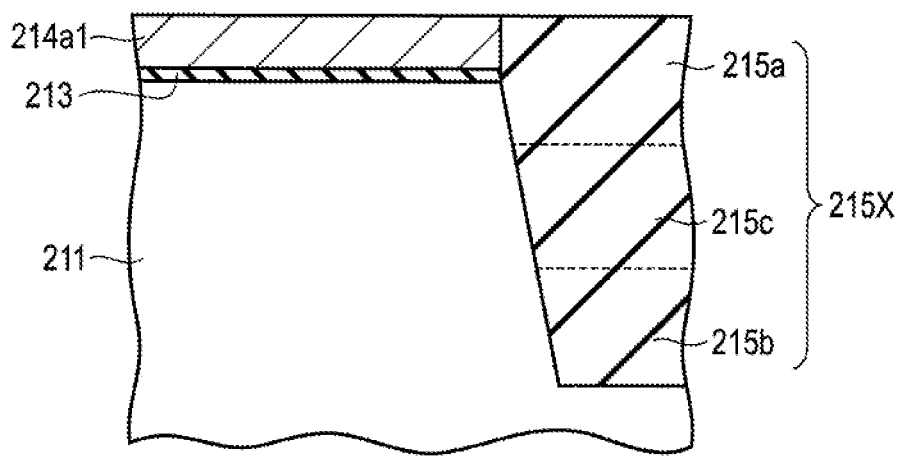

In the second method, as shown in FIG. 4I, the insulating layer 215 is recessed, that is, the upper portion of the insulating layer 215 is removed. Next, as shown in FIG. 4J, an insulating layer is deposited on the entire surface using a fluorine-containing gas, and further CMP is carried out using the polysilicon layer 214a1 as a stopper. Thus, the insulating layer 215X is obtained, in which the fluorine concentration of the upper portion 215a is higher than that of the lower portion 215b and that of the middle portion 215c. That is, the insulating layer 215X corresponding to the element isolation region 30 shown in FIG. 2A is obtained.

Note that in order to form the insulating layer 215 by the process of FIG. 4F described above, the insulating layer 215X may be deposited using a fluorine-containing gas. In this case, while depositing the insulating layer 215X, the concentration of the fluorine-containing gas is adjusted (changed) to make the fluorine concentration for the upper portion 215a of the insulating layer 215X higher than that of the lower portion 215b and that of the middle portion 215c.

Figure 4K:
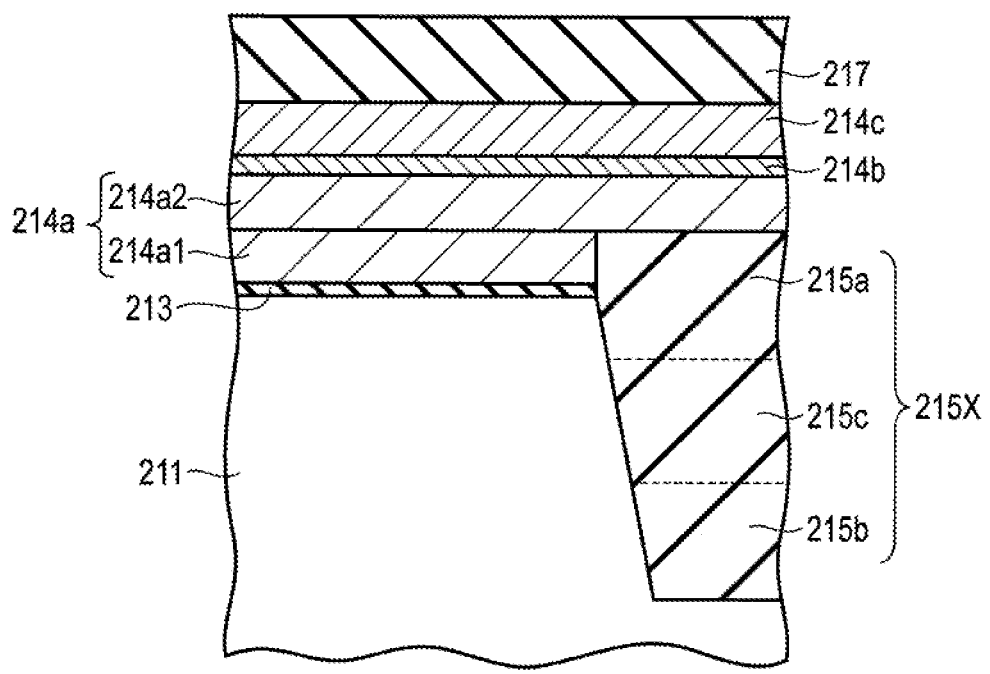

Next, as shown in FIG. 4K, a polysilicon layer 214a2, a tungsten nitride layer 214b, a tungsten layer 214c and a silicon nitride layer 217 are formed sequentially. Thus, a stacked layer of the polysilicon layer 214a (214a1+214a2), the tungsten nitride layer 214b, the tungsten layer 214c and the silicon nitride layer 217 is formed.

After carrying out the processing steps shown in FIGS. 4A to 4K described above, steps shown in FIGS. 5A to 5E are carried out.

Figure 5A:
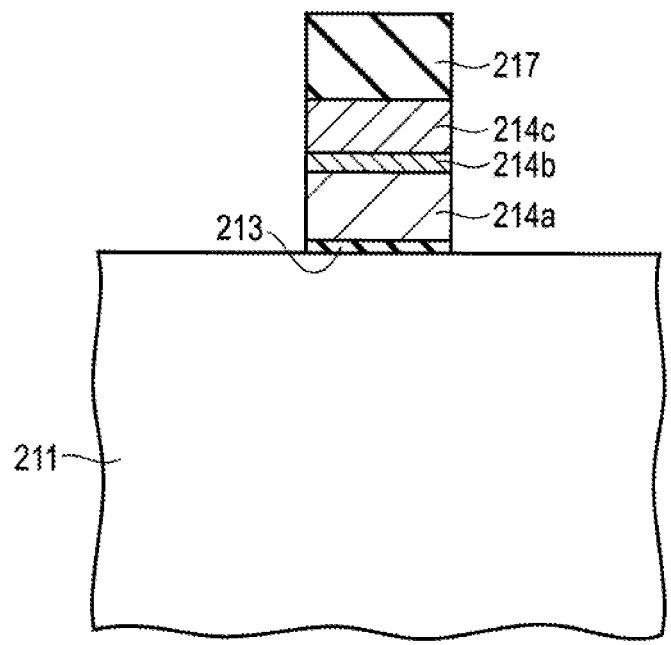

In the step of FIG. 5A, after forming a resist mask (not shown) on the silicon nitride layer 217, the silicon nitride layer 217 is patterned using the resist pattern as a mask. Then, the tungsten layer 214c, the tungsten nitride layer 214b, the polysilicon layer 214a and the insulating layer 213 are patterned using the patterned silicon nitride layer 217 as a mask. Thus, a stacked structure having a shape corresponding to the gate electrode is formed on the insulating layer 213.

Next, as shown in FIG. 5B, an oxide layer (for example, silicon oxide layer) is formed on a side surface and an upper surface of the stacked structure described above.

Next, as shown in FIG. 5C, an n-type impurity (for example, arsenic (As) or phosphorous (P)) is ion-implanted into the silicon layer 211, using the stacked structure described above as a mask, and thus a halo layer 219a is formed. Then, boron fluoride is ion-implanted into the silicon layer 211, using the stacked structure as a mask, and thus an impurity layer 219b is formed.

Next, as shown in FIG. 5D, a gate side wall 220 of an insulating material (for example, silicon oxide) is formed on a side portion of the stacked structure.

Next, as shown in FIG. 5E, boron fluoride is ion-implanted into the silicon layer 211, using the stacked structure and the gate side wall 220 described above as a mask, and thus an impurity layer 219c is formed. Further, the impurities in the halo layer 219a, the impurity layer 219b and the impurity layer 219c are activated by annealing, and thus the source region and the drain region are formed from the impurity layer 219b and the impurity layer 219c.

Thereafter, the portion of the insulating film 218, which is not covered by the stacked structure and the gate side wall 220 described above is removed.

As described above, a semiconductor device which has a structure corresponding to the structure shown in FIGS. 2A and 2B is obtained.

Figure 6A:
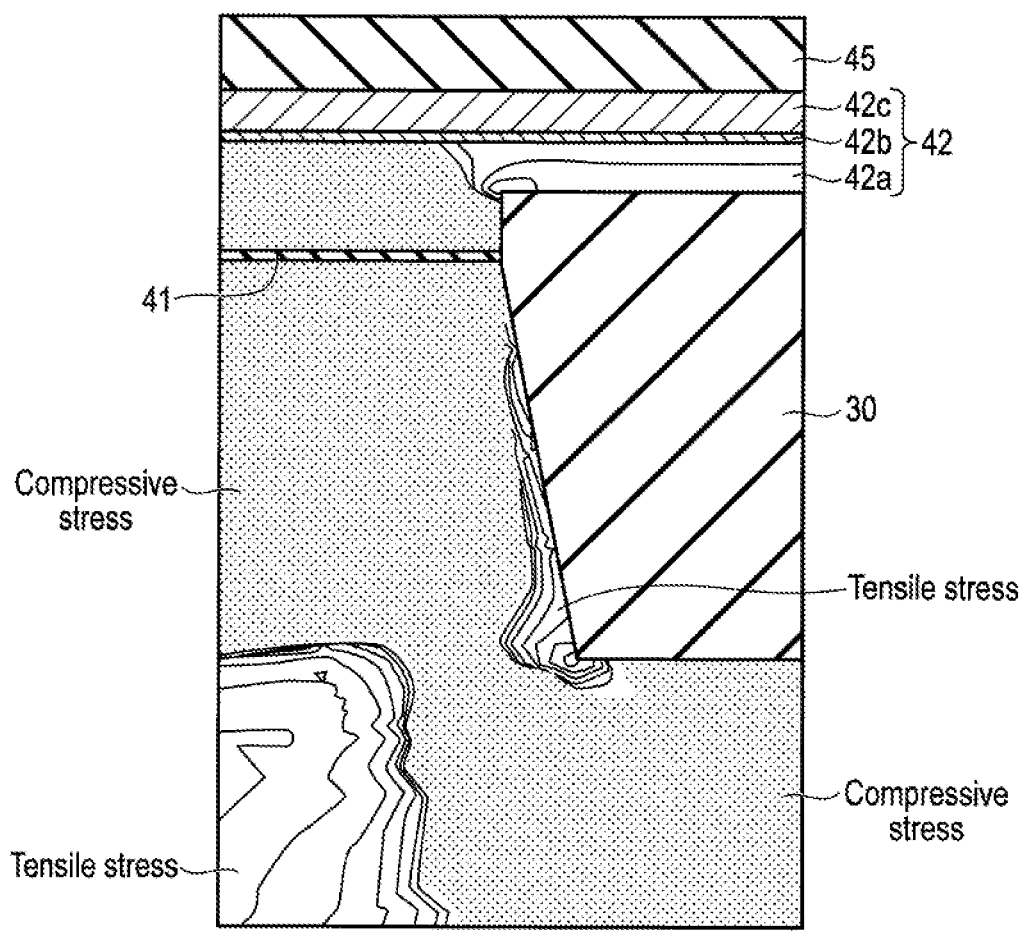
FIGS. 6A, 6B and 6C each is a diagram showing a result of simulation in stress distribution.
Figure 6B:
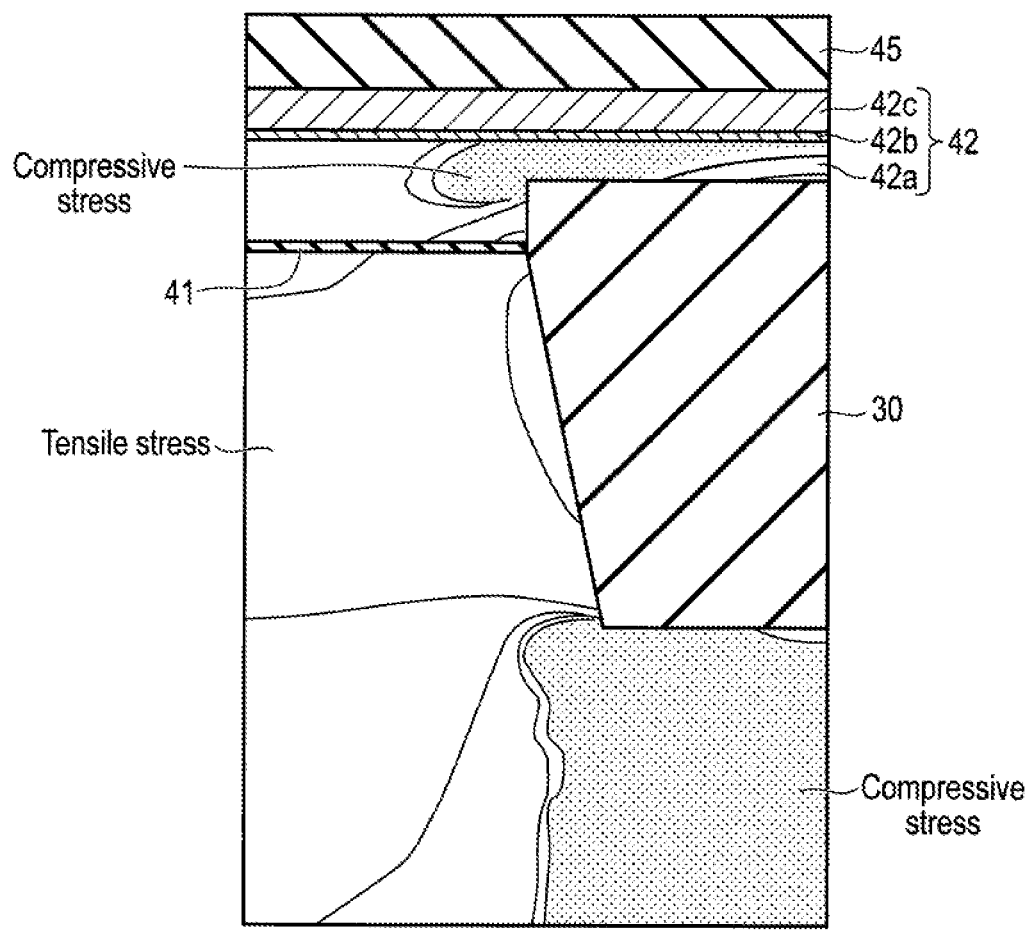
Figure 6C:
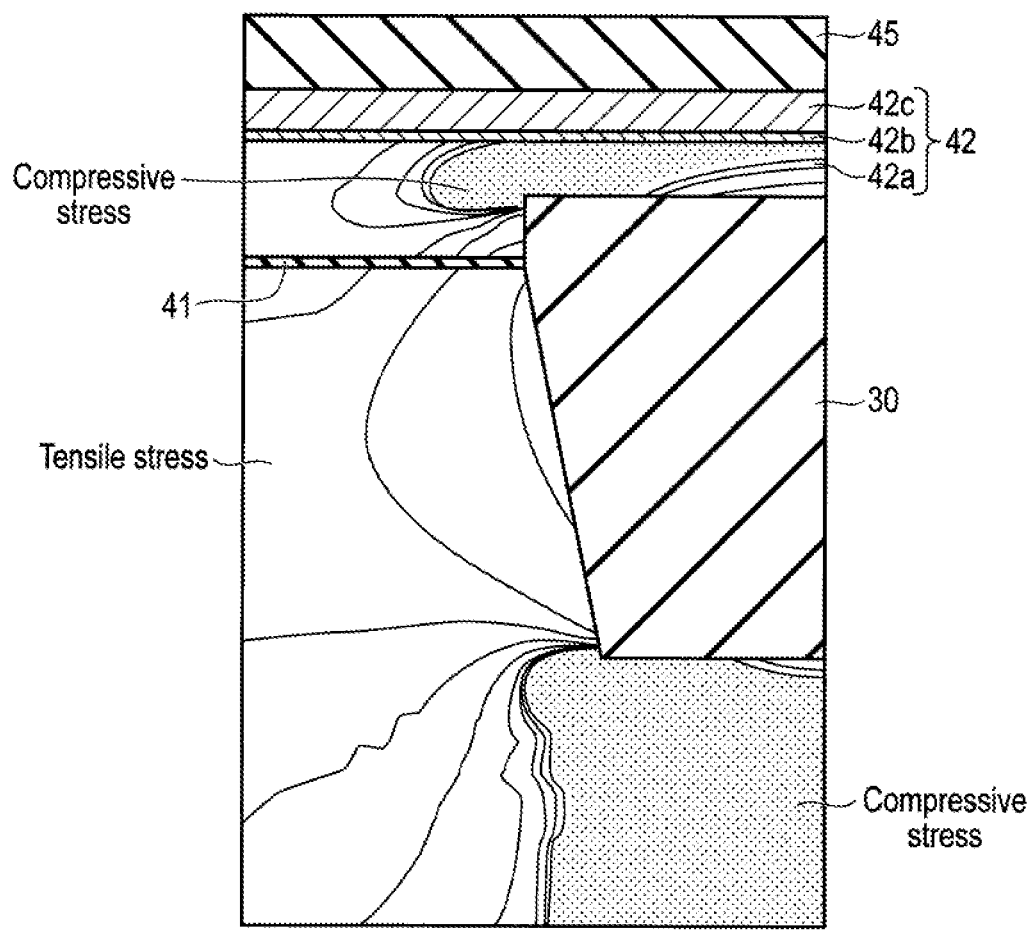

Next, results of simulation in stress distribution will be described. FIG. 6A shows a simulation result when using the element isolation region 30 of this embodiment. FIG. 6B shows a simulation result when using a material having a Young's modulus equivalent to that of silicon oxide ($SiO_2$) for the element isolation region 30 (Comparative Example 1). FIG. 6C shows a simulation result when using a material having a Young's modulus higher than that of silicon oxide ($SiO_2$) for the element isolation region 30 (Comparative Example 2).

As can be seen from FIGS. 6B and 6C, in Comparative Examples 1 and 2, tensile stress is applied to substantially the entire element region 20. By contrast, in the case of this embodiment, as shown in FIG. 6A, compressive stress is applied over an entire region of the upper portion of the element region 20.

Figure 7:
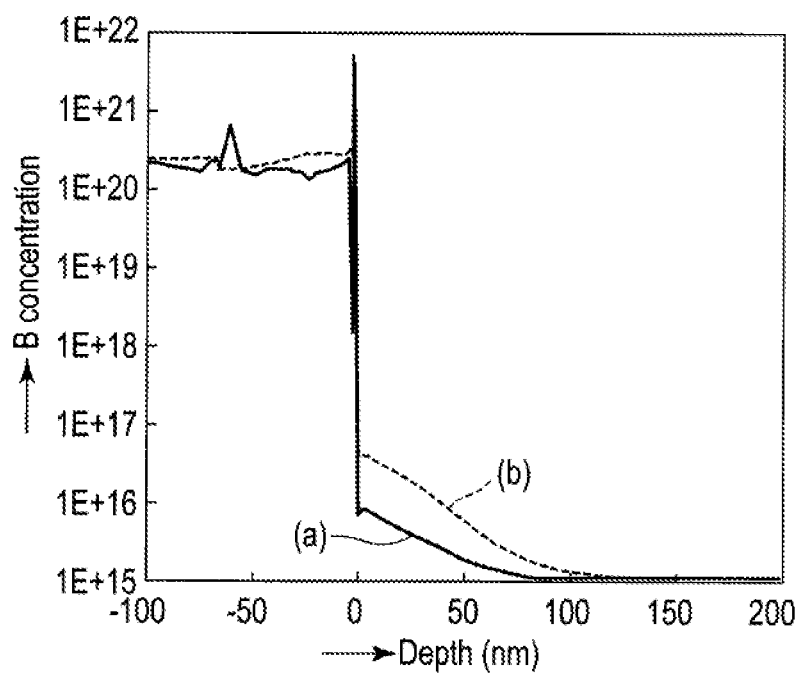
FIG. 7 is a diagram showing a result of simulation in concentration distribution of boron (B) in a depth direction.
Figure 8:
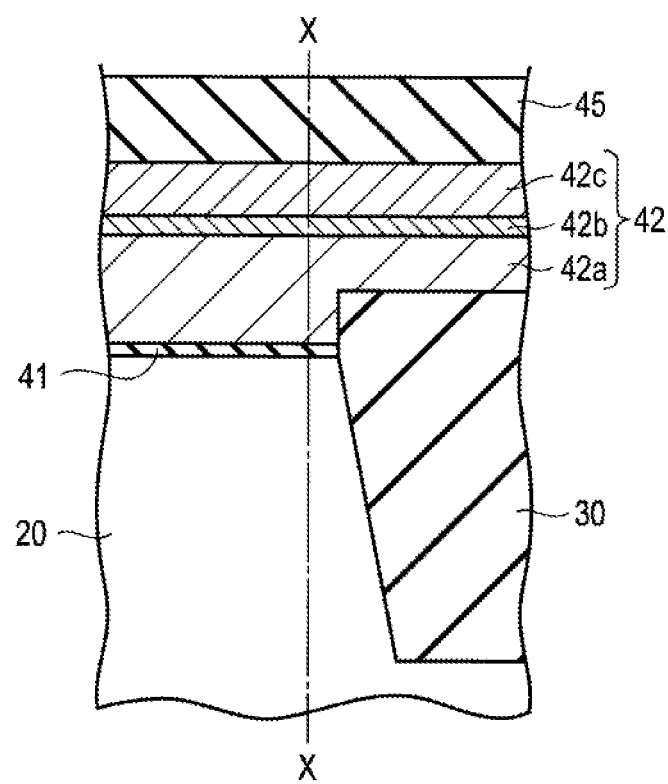
FIG. 8 is a diagram showing a part used for the simulation of FIG. 7.

Next, results of simulation in concentration distribution of boron (B) will be described with reference to FIG. 7. Specifically, the simulation results of the concentration distribution taken along line X-X of FIG. 8 will be described. FIG. 7 (a) shows a simulation result when using the element isolation region 30 (the element isolation region of low Young's modulus) of this embodiment. FIG. 7 (b) shows a simulation result when using the element isolation region 30 (the element isolation region of Young's modulus equivalent to that of silicon oxide ($SiO_2$)) of the comparative example.

As can be seen from FIGS. 7 (a) and (b), with the structure of the element isolation region 30 of this embodiment, the concentration of boron penetrating from the semiconductor layer 42a of the gate electrode 42 through to the element region 20 decreased.

From the simulation results described above with reference to FIGS. 6A, 6B and 6C, and the simulation results of FIG. 7, it can be understood that by setting the Young's modulus of the element isolation region 30 at low, compressive stress can be applied to the element region 20 and the concentration of boron penetrating from the semiconductor layer 42a of the gate electrode 42 through to the element region 20 can be decreased.

Next, simulation results in the relationship (Id–Vg characteristics) between a gate voltage Vg and the drain current Id of MOS transistors will be described with reference to FIG. 9.

FIG. 9 (a) shows a simulation result of a MOS transistor (a MOS transistor with a small amount of penetrating boron) when using the element isolation region 30 (the element isolation region of low Young's modulus) of this embodiment. FIG. 9 (b) shows a simulation result of a MOS transistor (a MOS transistor with a great amount of penetration boron) when using the element isolation region 30 (the element isolation region of Young's modulus equivalent to that of silicon oxide ($SiO_2$)) of a comparative example.

As can be seen from FIGS. 9 (a) and (b), with the structure of the element isolation region 30 of this embodiment, the drain current Id increases when the gate voltage Vg is at an ON-state voltage.

In order to investigate the reason why the drain current of an MOS transistor increases when the element isolation region 30 of this embodiment is used, the relationship (Cg–Vg characteristics) between the gate voltage Vg and the gate capacitance Cg was obtained from simulation for each of the cases where the element isolation region 30 (the element isolation region of low Young's modulus) of this embodiment is used and where the element isolation region 30 (the element isolation region of Young's modulus equivalent to that of silicon oxide ($SiO_2$)) of a comparative example is used. The simulation results are shown in FIG. 10. FIG. 10 (a) shows a simulation result in this embodiment, and FIG. 10 (b) shows a simulation result in the comparative example.

As shown in FIG. 10 (a), in the case of this embodiment, the gate capacitance Cg is constant when the gate voltage Vg is near −2V. By contrast, as shown in FIG. 10 (b), in the case of the comparative example, the value of the gate capacitance Cg decreases as the gate voltage Vg approaches −2V. This is considered because, in the case of the comparative example, the boron concentration of the semiconductor layer 42a of the gate electrode 42 decreases by penetration of boron, and therefore the width of the depletion layer in the semiconductor layer 42a increases according to the gate voltage Vg. As a result, the electric field between the semiconductor layer 42a and the element region 20 is relaxed, and in the comparative example, the drain current decreases.

Moreover, when the concentration of boron penetrating from the semiconductor layer 42a is higher than the channel concentration of the element region 20, the source region and the drain region are connected to each other, thereby significantly deteriorating the cut-off characteristics.

As described above, according to this embodiment, the penetration of boron can be suppressed, and therefore it is possible to suppress degradation of the MOS transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an element region including a source region and a drain region;
   an element isolation region adjacent to the element region;
   a gate insulating layer provided on an upper surface of the element region; and
   a gate electrode including a semiconductor layer, the semiconductor layer containing boron (B) and including a portion provided on the gate insulating layer;
   the element isolation region including an upper portion including an upper surface of the element isolation region and a lower portion including a lower surface of the element isolation region,
   the upper portion of the element isolation region applying compressive stress to a portion of the element region, which is adjacent to the upper portion of the element isolation region, and
   the compressive stress being applied to the portion of the element region in a direction along which the gate electrode extends such that end portions of the element region are in compression, wherein
     the lower portion of the element isolation region applies tension stress to a portion of the element region, which is adjacent to the lower portion of the element isolation region.

2. The semiconductor device of claim 1, wherein the element isolation region contains fluorine (F).

3. The semiconductor device of claim 2, wherein a concentration of fluorine (F) contained in the element isolation region is higher in the upper portion of the element isolation region than in the lower portion of the element isolation region.

4. The semiconductor device of claim 1, wherein the upper portion of the element isolation region has a Young's modulus lower than that of the lower portion of the element isolation region.

5. The semiconductor device of claim 1, wherein the semiconductor layer includes an upper surface leveled higher than the upper surface of the element isolation region.

6. The semiconductor device of claim 1, wherein the semiconductor layer further includes a portion provided on the upper surface of the element isolation region.

7. The semiconductor device of claim 1, wherein a material of the element isolation region is a silicon oxide.

8. The semiconductor device of claim 1, wherein a material of the element region is silicon.

9. The semiconductor device of claim 1, wherein a material of the semiconductor layer is silicon.

10. A semiconductor device comprising:
    an element region;
    an element isolation region adjacent to the element region;
    a gate insulating layer provided on an upper surface of the element region; and
    a gate electrode including a semiconductor layer, the semiconductor layer containing boron (B) and including a portion provided on the gate insulating layer;
    the element isolation region including an upper portion including an upper surface of the element isolation region, a lower portion including a lower surface of the element isolation region, and a middle portion between the upper portion and the lower portion, and
    the element isolation region containing fluorine (F), and a concentration of fluorine (F) contained in the element isolation region being higher in the upper portion of the element isolation region than in the middle portion of the element isolation region and being lower in the lower portion of the element isolation region than in the middle portion of the element isolation region, wherein
    the upper portion of the element isolation region is located adjacent to the semiconductor layer and applies a compressive stress to the semiconductor layer.

11. The semiconductor device of claim 10, wherein the upper portion of the element isolation region has a Young's modulus lower than that of the lower portion of the element isolation region.

12. The semiconductor device of claim 10, wherein the semiconductor layer includes an upper surface leveled higher than the upper surface of the element isolation region.

13. The semiconductor device of claim 10, wherein the semiconductor layer further includes a portion provided on the upper surface of the element isolation region.

14. The semiconductor device of claim 10, wherein a material of the element isolation region is a silicon oxide.

15. The semiconductor device of claim 10, wherein a material of the element region is silicon.

16. The semiconductor device of claim 10, wherein a material of the semiconductor layer is silicon.

17. A semiconductor device comprising:
    an element region including a source region and a drain region;
    an element isolation region adjacent to the element region;

a gate insulating layer provided on an upper surface of the element region; and a gate electrode including a semiconductor layer, the semiconductor layer containing boron (B) and including a portion provided on the gate insulating layer;

the element isolation region including an upper portion including an upper surface of the element isolation region and a lower portion including a lower surface of the element isolation region, the upper portion of the element isolation region applying compressive stress to a portion of the element region, which is adjacent to the upper portion of the element isolation region, and the compressive stress being applied to the portion of the element region in a direction along which the gate electrode extends such that end portions of the element region are compressed, wherein the upper portion of the element isolation region is located adjacent to the semiconductor layer and applies a compressive stress to the semiconductor layer.

* * * * *